United States Patent
Chowdhury et al.

(10) Patent No.: US 11,942,401 B2
(45) Date of Patent: Mar. 26, 2024

(54) HALF-BRIDGE SEMICONDUCTOR DEVICE

(71) Applicant: NEXPERIA B.V., Nijmegen (NL)

(72) Inventors: Dilder Chowdhury, Nijmegen (NL); Ricardo Lagmay Yandoc, Nijmegen (NL); Saurabh Pandey, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 479 days.

(21) Appl. No.: 17/070,381

(22) Filed: Oct. 14, 2020

(65) Prior Publication Data

US 2021/0111107 A1 Apr. 15, 2021

(30) Foreign Application Priority Data

Oct. 15, 2019 (EP) .................................... 19203160

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC .... *H01L 23/49575* (2013.01); *H01L 21/4825* (2013.01); *H01L 21/565* (2013.01); *H01L 23/3107* (2013.01); *H01L 23/4951* (2013.01); *H01L 23/49562* (2013.01); *H01L 23/49568* (2013.01)

(58) Field of Classification Search
CPC ........... H01L 23/49575; H01L 23/3107; H01L 23/4951; H01L 23/49562; H01L 23/49568; H01L 21/4825; H01L 21/565
See application file for complete search history.

(56) References Cited

U.S. PATENT DOCUMENTS

| 2012/0223321 | A1 | 9/2012 | Lin et al. |
| 2014/0225162 | A1 | 8/2014 | Briere |
| 2014/0231829 | A1* | 8/2014 | Kanazawa .......... H01L 27/0617 257/77 |
| 2015/0041984 | A1* | 2/2015 | Otremba ........... H01L 23/49513 257/773 |
| 2015/0255455 | A1* | 9/2015 | Kanazawa .......... H01L 27/0883 318/504 |

FOREIGN PATENT DOCUMENTS

WO 2017002390 A1 1/2017

OTHER PUBLICATIONS

Extended European Search Report for priority European application No. EP19203160.7 9 pages, dated Feb. 28, 2020.

* cited by examiner

*Primary Examiner* — Marc Anthony Armand
(74) *Attorney, Agent, or Firm* — Ruggiero, McAllister & McMahon LLC

(57) ABSTRACT

This disclosure relates to a discrete half bridge semiconductor device including a first cascode arrangement and a second cascode arrangement. Each of the first cascode and second cascode arrangements include a high voltage FET device die and a low voltage FET device die; and the source of the high voltage FET device die is mounted on and connected to a drain of the low voltage FET device die. The source of the low voltage FET device die and gate of the high voltage FET device die are connected to a drain terminal of the high voltage FET device die of the second cascode arrangement at a common connection pad.

19 Claims, 7 Drawing Sheets

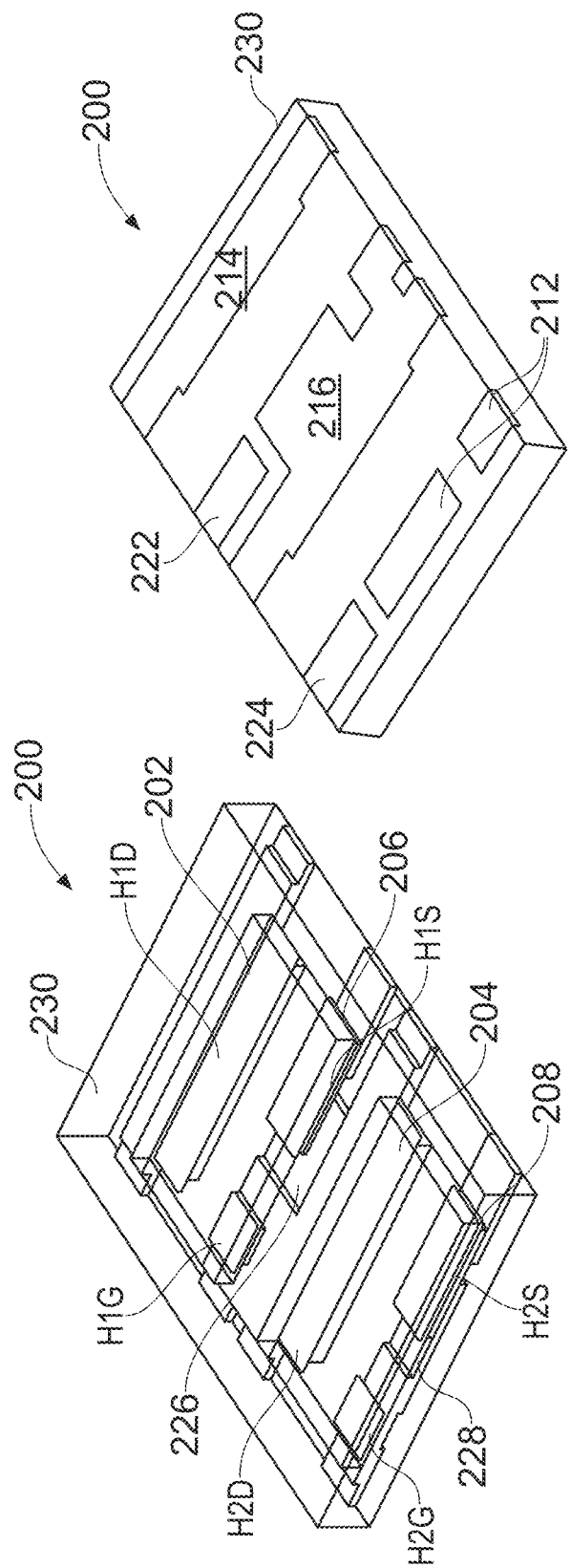

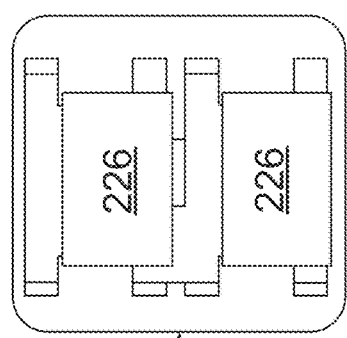
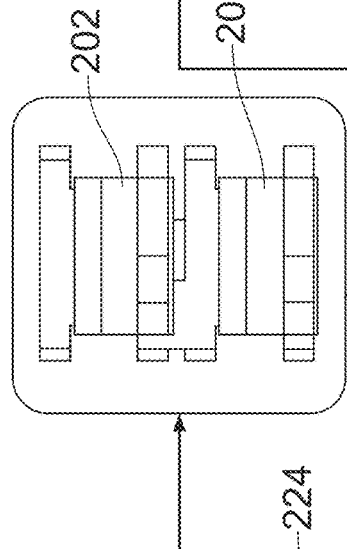
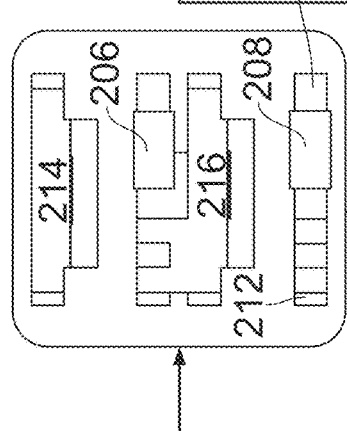
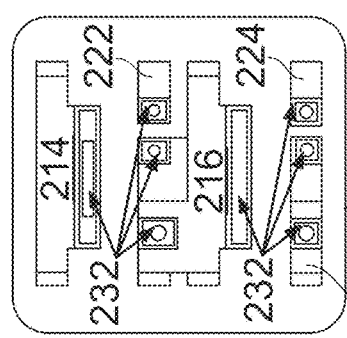
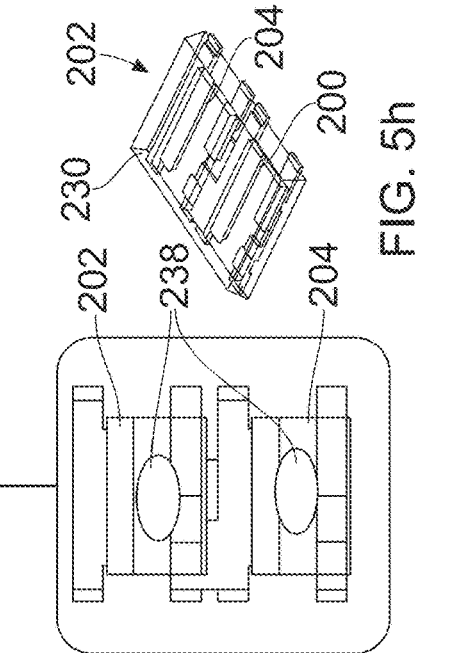
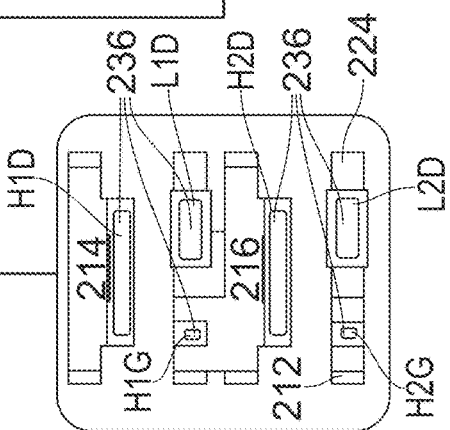
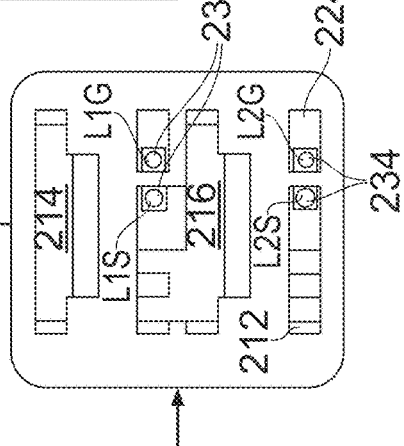

HALF-BRIDGE SEMICONDUCTOR DEVICE

CROSS REFERENCE TO RELATED APPLICATION

This application claims the benefit under 35 U.S.C. § 119(a) of European Application No. 19203160.7 filed Oct. 15, 2019 the contents of which are incorporated by reference herein in their entirety.

BACKGROUND OF THE DISCLOSURE

1. Field of the Disclosure

The present disclosure relates to a discrete half-bridge semiconductor device. In particular the disclosure relates to a discrete half-bridge semiconductor device comprising cascode arranged depletion mode transistor dies and enhancement mode transistor dies, and an associated method of assembling such a discrete half-bridge semiconductor device.

2. Description of the Related Art

Cascode arrangements of transistors are well known, in particular for controlling normally on (or depletion mode) at zero gate-source voltage, high voltage semiconductor die using a normally off, low voltage semiconductor die. Cascode arrangements can be used in switched mode applications, especially in power supplies, where efficient energy switching is required.

Typically, a half-bridge arrangement of the type as shown in FIG. 1 is achieved by external connections between two cascode arrangements 100, 100'. The external connection may be arranged as a track or conductive trace on a printed circuit board (PCB) or as a wire connection between the two cascode arrangements. In half-bridge arrangement the drain of the second cascode arrangement 100' is connected to the source terminal, common with the gate of the high voltage device 104, of the first cascode arrangement 100.

The cascode arrangements 100, 100' of FIG. 1 may each comprise a normally off (or enhancement mode) low voltage device 102, 102' which is placed in series with a respective high voltage depletion mode device 104, 104', by the common connection of a gate of the high voltage device 104, 104' to a source of the low voltage device 102, 102' and a drain of the low voltage device 102, 102' to the source of the high voltage device 104, 104'. The high voltage depletion mode device 104, 104' can thus be switched off when the drain source voltage of the low voltage enhancement mode device 102,102' reaches the threshold voltage of the high voltage device 104. The addition of a low voltage device enhancement mode device 102, 102' in a cascode arrangement with the high voltage depletion mode device 104, 102' therefore allows the normally on high voltage device to operate as a normally off, or enhancement mode device.

The above mentioned connections between the two cascode arrangements 100, 100' may suffer from the problem of DC power and switching losses due to the inductance effects in the wires during operation. Using wire-bonded connections can result in higher parasitic inductances and capacitances, which can result in so-called gate bounce. Gate bounce is a false turn on mechanism where during high frequency switching operation, the high voltage device is switched to an "on" state when it should be in an "off" state. Moreover, device resistances such as RDSon may increase and wire connections can be subject to failure particularly at high voltage operation of the high voltage device.

Further problems exist with known arrangements. For example, where in switched mode applications power density is important for the switching power conversion and the power density can be improved if the switching losses are minimised by lowering the inductances and resistances in the cascode and half bridge connections.

Yet further, the known arrangements described above are complex to manufacture and require two separate and optimised device packages to form the half-bridge arrangement described above.

SUMMARY

Various example embodiments are directed to issues such as those addressed above and/or others which may become apparent from the following disclosure concerning improving the electrical and thermal performance of cascode connected high voltage and low voltage transistors in a half-bridge configuration. In particular various example embodiments reduce parasitic inductances and resistances with optimised layout allowing for higher frequency operation with reduced electromagnetic interference (EMI) and lower electromagnetic coupling (EMC).

In certain example embodiments, aspects of the present disclosure involve the placement of a high voltage transistor die with respect to the low voltage transistor die in a cascode arrangement and the manner of the electrical connections between two such cascode arrangements to form a half-bridge configuration.

According to an embodiment there is provided a discrete half bridge semiconductor device comprising: a first cascode arrangement and a second cascode arrangement; each of the first cascode and second cascode arrangements comprising a high voltage FET device die and a low voltage FET device die; wherein the source of the high voltage FET device die is mounted on and connected to a drain of the low voltage FET device die; and the source of the low voltage FET device die and gate of the high voltage FET device die are connected to a drain terminal of the high voltage FET device die of the second cascode arrangement at common connection pad. The high voltage FET device dies may be lateral device dies and the low voltage FET device dies are vertical device dies.

The high voltage FET device dies may be flip mounted on the flipped low voltage FET device dies.

With respect to the first cascode arrangement the gate terminal of the high voltage FET device die and the source terminal of the low voltage FET device die may be mounted on respective contact pads, and with respect to the second cascode arrangement the drain terminal of the high voltage FET device die may be mounted on a respective contact pad.

The respective contact pads may be arranged on a first common conductive member.

The first common conductive member may form an electrical connection between the first cascode arrangement to the second cascode arrangement.

The first common connection between first cascode arrangement and the second cascode arrangement may substantially internal to the discrete half bridge semiconductor device.

The discrete half bridge semiconductor device according to embodiments, further comprising first and second, second common connections between the source terminal of the high voltage FET device die and the drain terminal of the low voltage FET device die.

The discrete half bridge semiconductor device according to embodiments, further comprising a third common connection between the source terminal of the low voltage FET device die and the gate terminal of the high voltage FET device die of the second cascode arrangement.

Each of the first and second, second common connections and third common connections are electrically conductive members comprising contact pads for receiving the respective terminals of the respective high voltage FET device dies and low voltage FET device dies.

The high voltage FET device dies are depletion mode devices and the low voltage FET device dies are enhancement mode devices.

According to an embodiment there is provided a method of manufacturing a discrete half bridge semiconductor device, the method comprising: providing a first cascode arrangement and a second cascode arrangement each of the first cascode and second cascode arrangements comprising a high voltage FET device die and a low voltage FET device die; mounting and directly connecting a source of the high voltage FET device die to a drain of the low voltage FET device die; and connecting the source of the low voltage FET device die and gate of the high voltage FET device die to a drain terminal of the high voltage FET device die of the second cascode arrangement at common connection pad.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 3c illustrates a top side perspective view of a half bridge arrangement of cascode arranged depletion mode transistor dies and enhancement mode transistor dies according to an embodiment.

FIG. 3d illustrates a back side perspective view of a half bridge arrangement of cascode arranged depletion mode transistor dies and enhancement mode transistor dies according to an embodiment.

FIGS. 5a to 5h illustrate the various steps in an example process flow for assembling the half bridge semiconductor device according to embodiments.

DETAILED DESCRIPTION

Figure 1:
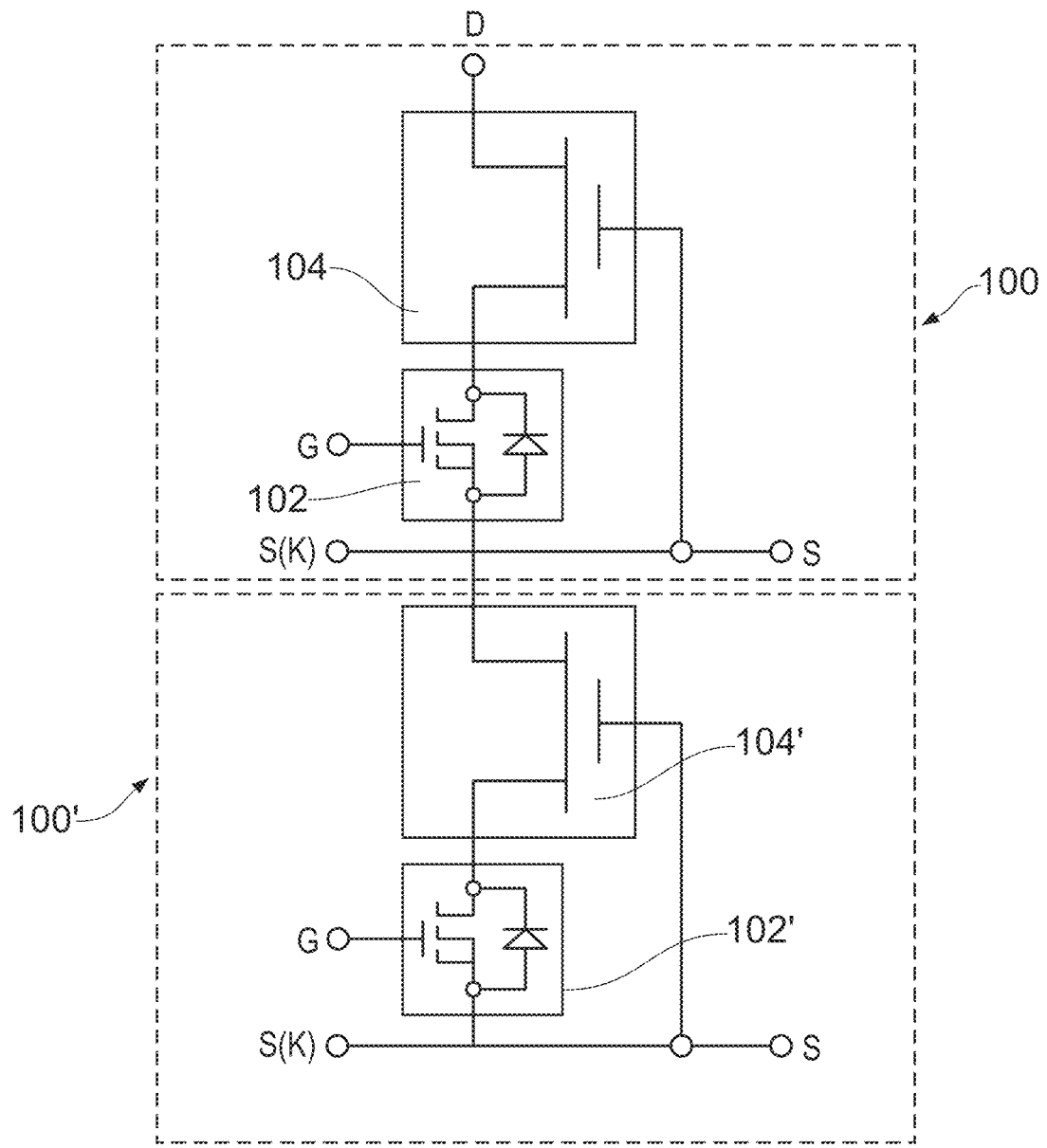
FIG. 1 is circuit diagram of a known half bridge arrangement of cascode arranged depletion mode transistor dies and enhancement mode transistor dies.

In the following description of embodiments, the high voltage device die(s) may be selected from a GaN based transistor, a GaN based HEMT or a SiC based transistor, and the low voltage device die(s) may be field effect transistors.

FIGS. 2a to 2d illustrate a half bridge semiconductor device 200 according to an embodiment. The half bridge semiconductor device 200 comprises a first cascode arrangement 201 and a second cascode arrangement 203. The first cascode arrangement 201 comprises a high voltage device die 202 and a low voltage device die 206. Likewise, the second cascode arrangement 203 comprises a high voltage device die 204 and a low voltage device die 208. In the case of the first and second cascode arrangements 201, 203, the high voltage device dies 202, 204 may be a depletion mode, or normally on, HEMT or JFET and may for example be a GaN or SiC based device. The low voltage device dies 206, 208 may be an enhancement mode, or normally off, MOSFET.

The high voltage depletion mode device dies 202, 204 may be a Gallium Nitride (GaN) or Silicon Carbide (SiC) based JFET or HEMT, and the low voltage enhancement mode device dies 206, 208 may be a silicon (Si) based MOSFET and both the high and low voltage device are integrated into a single semiconductor device package 200. The high voltage devices 202, 204 and low voltage devices 206, 208 as described above are separate semiconductor device dies. The high voltage 202, 204 and low voltage devices 206, 208 are configured and integrated within a single package to form the half bridge semiconductor device 200 according to embodiments.

The high voltage devices 202, 204, such as HEMTs, are each formed with gate, source and drain terminals on a common (top) surface thereof and are thus considered to be lateral devices, as opposed to vertical devices where at least one of the terminals is formed on a bottom surface, opposite to the top surface. The half bridge semiconductor device 200 comprises various contact pads for mounting each of the high voltage 202, 204 and low voltage 206, 208 devices and making electrical connections to the respective source, gate and drain terminals of those devices.

With regard to the first cascode arrangement 201, a gate terminal H1G of the high voltage device 202 is electrically connected to and mounted on a respective gate pad 210. A drain terminal H1D of the high voltage device is electrically connected to and mounted upon a drain pad 214. The drain pad 214 integrally forms drain pins or leads 218 of the half bridge semiconductor device 200. The source terminal H1S of the high voltage device is electrically connected to and mounted directly on the drain terminal L1D of the low voltage device 206.

The source terminal L1S of the low voltage device 206 is also mounted on the gate pad 210 mentioned above with respect to the high voltage device 202, thereby completing the common high voltage device gate terminal H1G to low voltage device source terminal L1S connections and thus completing the cascode connection of the first cascode arrangement, consistent with the circuit of FIG. 1. This arrangement is discussed in more detail below in the context of a common connection pad.

Likewise, with regard to the second cascode arrangement 203, a gate terminal H2G of the high voltage device 204 is electrically connected to and mounted on a respective gate pad 212. A drain terminal H2D of the high voltage device is electrically connected to and mounted upon a drain pad 216. The drain pad 216 integrally forms drain pins or leads 220 of the half bridge semiconductor device 200. As discussed below this drain pad 216 also forms the half-bridge connection between the first cascode arrangement 201 and the second cascode arrangement 203. As with the first cascode arrangement 201, the source terminal H2S of the high voltage device is electrically connected to and mounted directly on the drain terminal L2D of the low voltage device 208.

The source terminal L2S of the low voltage device 208 is also mounted on the gate pad 212 mentioned above with respect to the high voltage device 204, thereby completing the common high voltage device gate terminal to low voltage device source terminal connection and thus completing the cascode connection of the second cascode arrangement, consistent with the circuit of FIG. 1.

In the case of both the first and second cascode arrangements, the high voltage devices 202, 204 which, as mentioned above are lateral devices, are rotated or flip mounted such that the respective gate and drain terminals H1G, H2G, H1D and H2D are electrically connected to and mounted on the respective gate 210, 212 and drain 214, 216 pads.

This flipped or inverted orientation of the high voltage devices 202, 204 reduces parasitics such as inductance and resistance. The reduction in parasitics results from the direct connection of the respective gate, drain terminals, H1G, H2G, H1D, H2D mounted on the respective gate 210, 212 and drain 214, 216 pads which reduces the distance therebetween thus reducing parasitic spreading resistances and inductances.

The low voltage devices 206, 208 of both first and second cascode configurations are arranged such that the drain terminals L1D, L2D are provided on respective first, or top sides of the devices, and gate terminals L1G, L2G and a source terminal L1S, L2S are provided on a second or bottom side, opposite side to the first side of the low voltage devices 206, 208. In this regard the low voltage devices 206, 208 may be vertical devices. In this way the low voltage devices 206, 208 facilitate the cascode connections to the respective high voltage 202, 204 lateral devices consistent with the circuit diagram of FIG. 1.

The gate terminals L1G, L2G of the low voltage devices 206, 208 are electrically connected to and mounted on the respective gate pads 222, 224 which each form a gate pin or lead for the respective low voltage devices 206, 208.

For the first cascode arrangement 201, the gate terminal H1G of the high voltage device 202 is electrically connected to the source terminal L1S of the low voltage device 206. This connection is achieved by way of the drain pad 216 (discussed above in relation to the drain pad of the drain terminal H2D of the high voltage device), where the drain pad 216 acts as a common connection pad 216, both electrically and mechanically for the cascode connections of first cascode arrangement 201 and the connection of the first cascode arrangement 201 to the second cascode arrangement 203. In this regard the gate terminal H1G of the high voltage device 202, the source terminal L1S of the low voltage device 206, and the drain terminal of the high voltage device 204 are electrically and mechanically connected to a top surface of the common connection pad 216. The respective electrical and mechanical connections to the common connection pad 216 may be made by an appropriate solder material or conductive adhesive and discussed in more detail below with respect to the method of assembling the semiconductor device according to embodiments.

The top surface of the common connection pad 216, includes a recess or cut away portion 226 formed thereon. The recess portion 226 is arranged to mountably receive the source terminal L1S of the low voltage device 206 thereon and in this way the depth of the recess portion 226, as formed in the common connection pad 216, is substantially equal to the thickness of the low voltage device 206 and any appropriate solder material or conductive adhesive arranged on the contact terminals thereof. In this way, when the high voltage device 202 is mounted on the common connection pad 216 and the low voltage device 206, the top surface (that is the surface comprising the contact terminals) of the high voltage device 202 is substantially parallel, that is not tilted, with respect to the common connection pad 216 and/or the low voltage device 206.

The thickness of the drain pad 214 is equal to the thickness of the common connection pad 216 out with the recess portion 226. This ensures that the drain terminal H1D and the gate terminal H1G of the high voltage device 202 are at the same level. The thickness of the gate pad 222 is equal to the thickness of the common connection pad 216 at the recess portion 226. When the low voltage device 206 is mounted on the recess portion 226 and the gate pad 222 this ensures that the drain terminal H1D, gate terminal H1G and source terminal H1S of the high voltage device 202 are level with respect to on another, and that that the back side surface (opposite the surface comprising the terminals) is also level with respect to the each of the aforementioned pads.

This stacked and flipped arrangement of the low voltage devices 206, 208 and the high voltage devices 202, 204 allows for near monolithic (that is single die like) behaviour of the high and low voltage devices due to the direct connection of the drain of the low voltage devices 206, 208 being connected and mounted on the source of the high voltage devices 202, 204.

This inverted or flipped arrangement of the low voltage devices 206, 208 and stacking on the high voltage devices 202, 204 avoids interconnect such as wires, tracks or clips between the drain and source, thereby reducing any parasitic inductance or resistance effects, thereby allowing high frequency of operation. This stacked arrangement also reduces costs because no dedicated interconnect is required and also improves ease of manufacturability.

Consistent with the half bridge circuit of FIG. 1, the configuration according to the embodiment of FIGS. 2a to 2d include an electrical connection between the first cascode arrangement 201 and the second cascode arrangement 203, whereby the common connection pad 216 is electrically and mechanically connected to the drain terminal H2D of the high voltage device 204 of the second cascode arrangement 203. In this regard, the common connection pad 216 integrally forms the drain pad of the high voltage device 204. In this way therefore, the common connection pad 216 provides a connection pad for each of: the gate terminal H1G of the high voltage device 204, the source terminal L1S of the low voltage device 206, each of the first cascode arrangement 201; and the drain terminal H2D of the high voltage device 204 of the second cascode arrangement 203. This results in optimum half-bridge configuration for high frequency applications because the mid-node, formed by the common connection pad 216, between the first cascode configuration 201 and second cascode configuration 203, is formed of a single piece of conductive material which reduces inductances where such inductances can prevent high frequency operation.

With regard to the second cascode arrangement 203, and consistent with the half bridge circuit of FIG. 1, the configuration according to the embodiment of FIGS. 2a to 2d the source terminal L2S of the low voltage device 208 is also mounted on the gate pad 212 thus forming the high voltage device 204 gate to low voltage source connection. As with the first cascode arrangement 201, the gate pad 212 comprises a recess portion 228 which forms a drain pad for electrically and mechanically mounting the drain terminal L2D of the low voltage device 208 thereon. The gate terminal of the low voltage device 208 is electrically and mechanically mounted on a respective gate pad 224, and the gate pad 224 is equal to the thickness of the gate pad 212 at the recess portion 228.

This ensures that the devices are level as discussed above with respect to the first cascode arrangements 201.

Figure 2A:
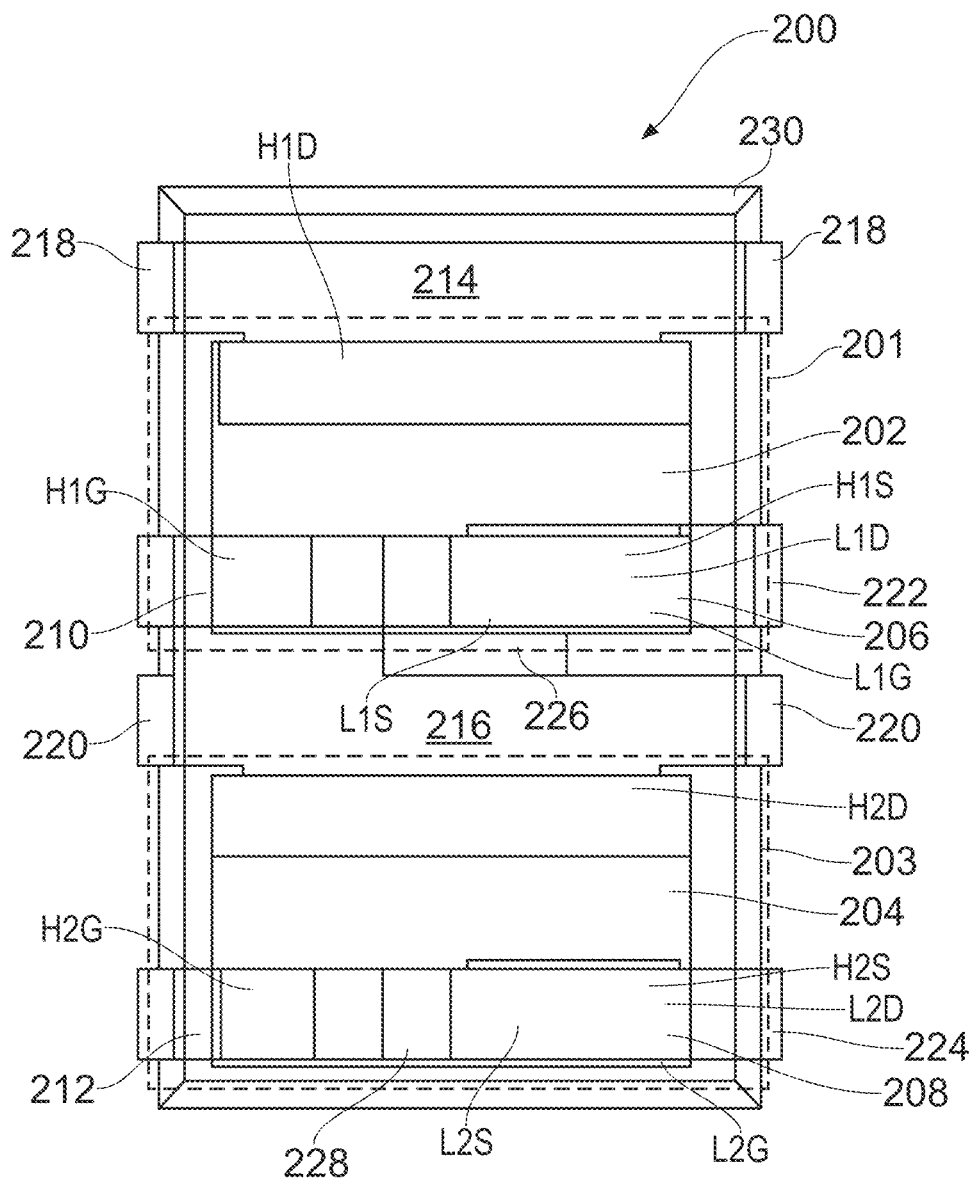
FIG. 2a illustrates a top view of a half bridge arrangement of cascode arranged depletion mode transistor dies and enhancement mode transistor dies according to an embodiment.
Figure 2B:
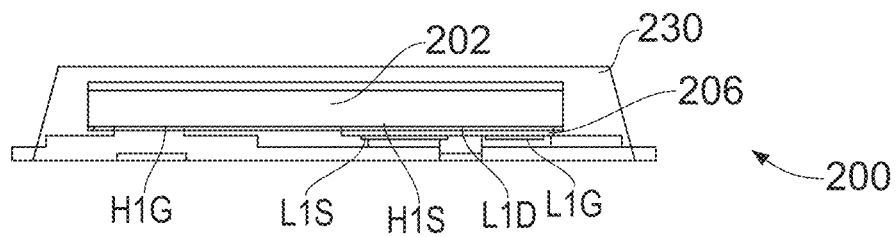
FIG. 2b illustrates a side view of a half bridge arrangement of cascode arranged depletion mode transistor dies and enhancement mode transistor dies according to an embodiment.
Figure 2D:
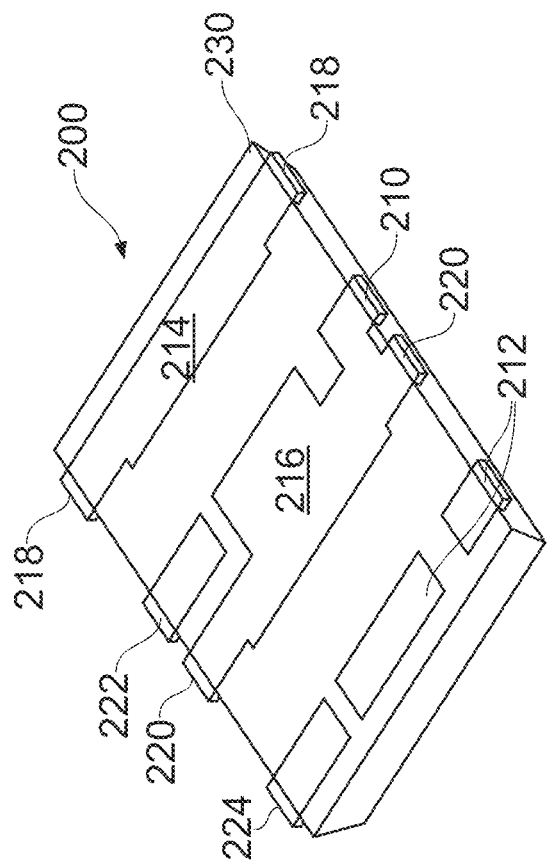
FIG. 2d illustrates a back side perspective view of a half bridge arrangement of cascode arranged depletion mode transistor dies and enhancement mode transistor dies according to an embodiment.
Figure 2C:
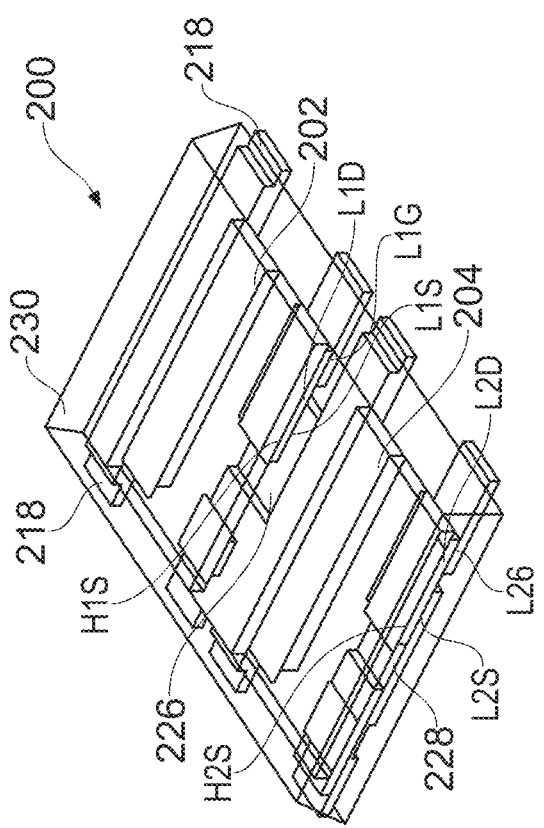
FIG. 2c illustrates a top side perspective view of a half bridge arrangement of cascode arranged depletion mode transistor dies and enhancement mode transistor dies according to an embodiment.
Figure 3A:
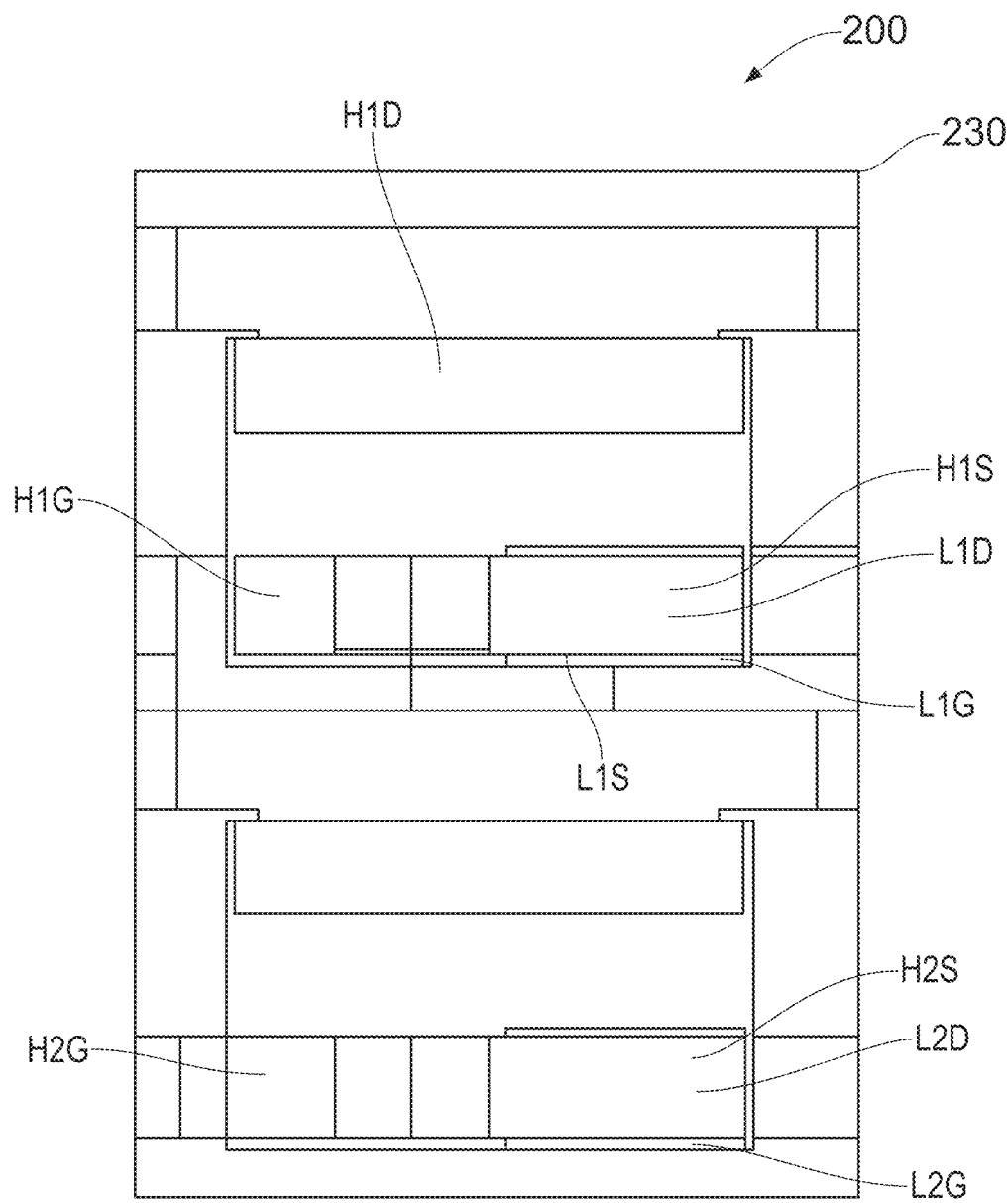
FIG. 3a illustrates a top side view of a half bridge arrangement of cascode arranged depletion mode transistor dies and enhancement mode transistor dies according to an embodiment.
Figure 3B:
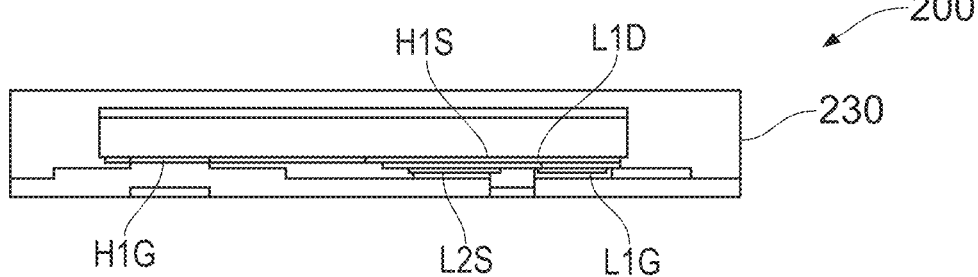
FIG. 3b illustrates a side view of a half bridge arrangement of cascode arranged depletion mode transistor dies and enhancement mode transistor dies according to an embodiment.

With regard to each of the pads as mentioned above, they may each include a lead portion extending therefrom. The lead portions are formed to make external connections of the respective source, gate or drain terminals to a carrier such as a printed circuit board (PCB). The lead portions may be formed to extend outside the footprint of the semiconductor device package material 230, as illustrated in FIGS. 2c and 2d, known as a leaded package. Likewise, the lead portions may not extend outside the footprint of the semiconductor device package material 230 as illustrated in the embodiment of FIGS. 3a to 3d, known as a non-leaded package. In this regard the leads may extend partially up the sidewalls of the semiconductor device 200, to form side solderable leads.

From the above discussion, the skilled person will therefore see that the respective high voltage devices 202, 204 and the low voltage devices 206, 208 of the first and second cascode arrangements are mounted in a stacked arrangement. This stacked arrangement, together with the inverted arrangement of the high voltage devices 202, allows for the provision of an optional additional electrical connection, drain-source lead 220 thereby providing electrical access to the mid-node (drain-source connection) of the first and second cascode arrangements. This allows for measurement of device parasitics, electrical connections and operational parameters of the device during use. In addition, when the semiconductor device is operating, it is possible to minimise the occurrences of unwanted gate bounce.

Figure 4:
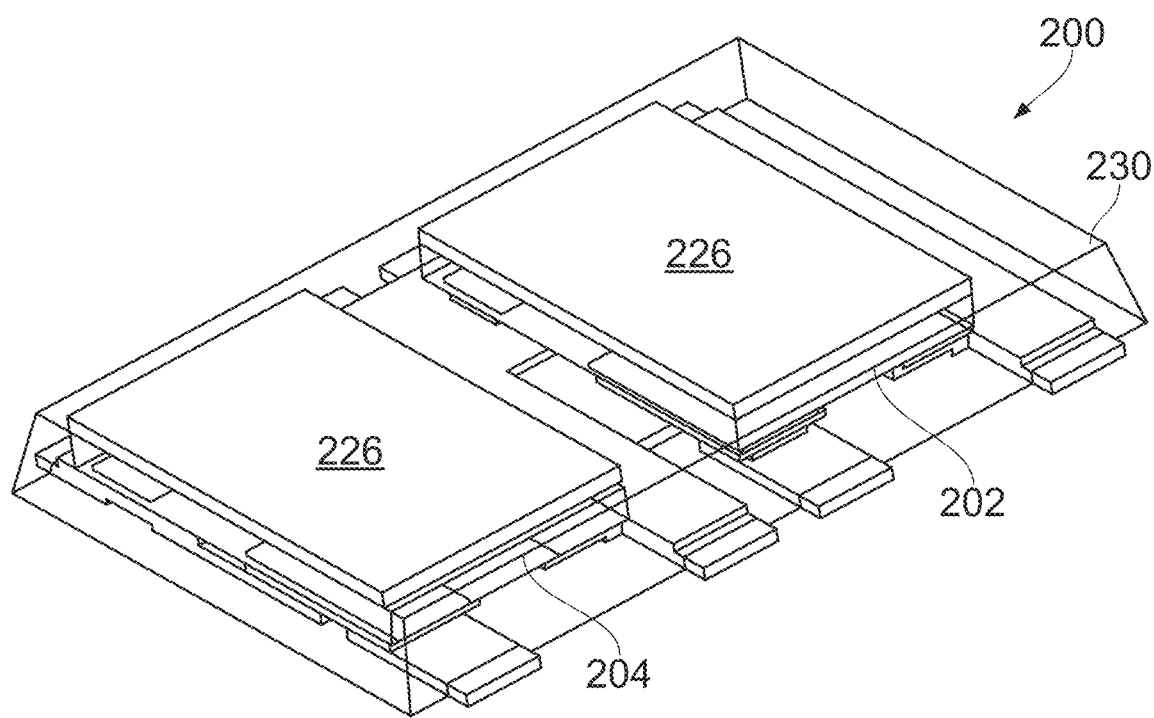
FIG. 4 illustrates a top side perspective view of a half bridge arrangement of cascode arranged depletion mode transistor dies and enhancement mode transistor dies according to an embodiment.

As illustrated in the embodiment of FIG. 4 an optional heat sink element 226 may be included on the backside of each of the high voltage devices 202, 204, that is the side of the high voltage devices 202, 204 opposite to the side on which the source H1S, gate H1G and drain H1D terminals are formed. The heat sink elements 226 may be formed of a conductive material and configured and arranged to dissipate heat from each of the high voltage devices 202, 204 during operation. As mentioned above, the high voltage devices 202, 204 are arranged in the semiconductor device 200, such that there are no electrical terminals on one side of the high voltage devices 202, 204. Therefore, the sink elements 226 may be placed directly on the high voltage device 202 as illustrated without the need to electrically isolate the backside of the high voltage devices 202, 204 from the heatsink elements 226. This direct placement of the heatsink element 226 allows for more efficient dissipation of heat during operation of the semiconductor device 200. Furthermore, the inverted, or flipped, orientation of the high voltage devices 202, 204 together with the stacked placement of the low voltage devices 206, 208, as discussed above, results in a cascode arrangement where additional isolation materials such as ceramic or DBC can be avoided. Consistent with the embodiment of FIG. 2a or 3a, the optional heat sink element 226 may be included on a leaded or non-leaded package.

An example method of assembling the semiconductor device 200 according to embodiments will be described with reference to FIGS. 5a to 5h. The following discussion relates to a method of assembling the semiconductor device with both leads and sink elements 226, however, the skilled person will see that whilst that the method is also equally applicable to the method of manufacturing the embodiments of FIGS. 2a to 2d, 3a to 3d, 4 and 5a to 5h.

Prior to the assembly of the semiconductor device 200, each of the source, gate and drain pads and gate leads may be formed from a unitary piece of conductive material as is understood in the art. One example method of forming the respective pads and leads is stamping a piece of metallic, conductive material. The stamping process defines the respective outlines of the pads and may also define any recessed or cutaway portions in the pads or leads as required.

The respective high voltage and low voltage device pads, as mentioned above, are illustrated in FIG. 5a and form the starting point for the method of assembly of the half bridge semiconductor device 200 according to embodiments. Whilst not previously illustrated (for clarity purposes), bond pads 232, in the form of an upstand may be arranged on the respective device pads to assist in the electrical and mechanical connection of the respective devices.

As illustrated in FIG. 5b, an appropriate solder or electrically conductive adhesive material 234 is dispensed onto the pads at the location where the source terminals L1S, L2S and gate terminals L1G, L2G of the low voltage devices 206, 208 are to be mounted (see FIG. 5c). The solder or adhesive material 234 may be dispensed for example by screen printing, but the skilled person will appreciate that any appropriate method may be used. With reference to FIG. 5c, the low voltage devices 206, 208 are then mounted on the pads at the respective locations of their source terminals L1S, L2S and gate terminals L1G, L2G corresponding to the respective locations of the solder or adhesive material 234 on the pads.

Referring now to FIG. 5d, following placement of the low voltage devices 206, 208 an appropriate solder or electrically conductive adhesive material 236 is dispensed onto the respective pads where the drain terminals H1D, H2D and gate terminals H1G, H2G of the high voltage devices 202, 204 are connected. An appropriate solder or electrically conductive adhesive material 236 is also dispensed on the drain terminals L1D, L2D of the low voltage devices 206, 208 for later attachment of respective the source terminal H1S, H2S of the high voltage device thereto.

With reference to FIG. 5e, the high voltage devices 202, 204 are then mounted on the pads at the respective locations of their drain terminals H1D, H2D and gate terminals H1G, H2G corresponding to the respective locations of the solder or adhesive material 234 on the pads. The source terminals H1S, H2S of the high voltage devices 202, 204 are mounted on the respective drain terminals L1D, L2D of the low voltage devices 206, 208.

Following placement of the high voltage devices 202, 204 the process can proceed to moulding of the half bridge semiconductor device 200, by encapsulating the device 200 in a mould material 230, follow by trimming and forming of the device leads as illustrated in FIG. 5g.

Optionally, sink elements 226 may be arranged on the high voltage devices 202, 204. As illustrated in FIG. 5f, an adhesive material is dispensed on the upper surfaces of the high voltage devices 202, 204, following which, the sink elements 226 are fixedly attached to the upper surfaces of the high voltage devices 202, 204.

Whilst the above process relates to the formation of the half bridge semiconductor device 200 as a leaded package, the skilled person will appreciate that the process is also applicable to the formation of a non-leaded package.

The above described embodiments provide for lower loop inductance when the half-bridge semiconductor device is mounted on an external carrier such as a printed circuit board.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A discrete half bridge semiconductor device comprising:
    a first cascode arrangement and a second cascode arrangement;
    each of the first cascode and second cascode arrangements comprising a high voltage FET device die and a low voltage FET device die;
    wherein the high voltage FET device die comprises a source that is mounted on and connected to a drain of the low voltage FET device die; and
    wherein the source of the low voltage FET device die and a gate of the high voltage FET device die are electrically and mechanically connected to a drain terminal of the high voltage FET device die of the second cascode arrangement at a common connection pad.

2. The discrete half bridge semiconductor device of claim 1, wherein the high voltage FET device dies are lateral device dies and the low voltage FET device dies are vertical device dies.

3. The discrete half bridge semiconductor device of claim 1, wherein the high voltage FET device dies are flip mounted on the flipped low voltage FET device dies.

4. The discrete half bridge semiconductor device of claim 2, wherein the high voltage FET device dies are flip mounted on the flipped low voltage FET device dies.

5. The discrete half bridge semiconductor device of claim 1, wherein with respect to the first cascode arrangement the gate of the high voltage FET device die and the source of the low voltage FET device die are mounted on respective contact pads, and with respect to the second cascode arrangement the drain of the high voltage FET device die is mounted on a respective contact pad.

6. The discrete half bridge semiconductor device of claim 2, wherein with respect to the first cascode arrangement the gate of the high voltage FET device die and the source of the low voltage FET device die are mounted on respective contact pads, and with respect to the second cascode arrangement the drain of the high voltage FET device die is mounted on a respective contact pad.

7. The discrete half bridge semiconductor device of claim 3, wherein with respect to the first cascode arrangement the gate of the high voltage FET device die and the source of the low voltage FET device die are mounted on respective contact pads, and with respect to the second cascode arrangement the drain of the high voltage FET device die is mounted on a respective contact pad.

8. The discrete half bridge semiconductor device of claim 5, wherein the respective contact pads are arranged on a first common conductive member.

9. The discrete half bridge semiconductor device of claim 8, wherein the first common conductive member forms an electrical connection between the first cascode arrangement to the second cascode arrangement.

10. The discrete half bridge semiconductor device of claim 8, wherein the first common connection between first cascode arrangement and the second cascode arrangement is substantially internal to the discrete half bridge semiconductor device.

11. The discrete half bridge semiconductor device of claim 9, wherein the first common connection between first cascode arrangement and the second cascode arrangement is substantially internal to the discrete half bridge semiconductor device.

12. The discrete half bridge semiconductor device of claim 1, further comprising first and second, second common connections between the source terminal of the high voltage FET device die and the drain terminal of the low voltage FET device die.

13. The discrete half bridge semiconductor device of claim 1, further comprising a third common connection between the source terminal of the low voltage FET device die and the gate terminal of the high voltage FET device die of the second cascode arrangement.

14. The discrete half bridge semiconductor device of claim 12, further comprising a third common connection between the source terminal of the low voltage FET device die and the gate terminal of the high voltage FET device die of the second cascode arrangement.

15. The discrete half bridge semiconductor device of claim 12, wherein each of the first and second, second common connections and third common connections are electrically conductive members comprising contact pads for receiving the respective terminals of the respective high voltage FET device dies and low voltage FET device dies.

16. The discrete half bridge semiconductor device of claim 13, wherein each of the first and second, second common connections and third common connections are electrically conductive members comprising contact pads for receiving the respective terminals of the respective high voltage FET device dies and low voltage FET device dies.

17. The discrete half bridge semiconductor device of claim 1, wherein the high voltage FET device dies are depletion mode devices and the low voltage FET device dies are enhancement mode devices.

18. The discrete half bridge semiconductor device of claim 15, wherein the high voltage FET device dies are depletion mode devices and the low voltage FET device dies are enhancement mode devices.

19. The discrete half bridge semiconductor device of claim 16, wherein the high voltage FET device dies are depletion mode devices and the low voltage FET device dies are enhancement mode devices.

\* \* \* \* \*